United States Patent
Ba (10) Patent No.: US 10,708,113 B2
(45) Date of Patent: Jul. 7, 2020

(54) DIGITAL POWER AMPLIFICATION CIRCUIT

(71) Applicant: Stichting IMEC Nederland, Eindhoven (NL)

(72) Inventor: Ao Ba, Maarssen (NL)

(73) Assignee: STICHTING IMEC NEDERLAND, Eindhoven (NL)

( * ) Notice: Subject to any disclaimer, the term of this patent is extended or adjusted under 35 U.S.C. 154(b) by 0 days.

(21) Appl. No.: 16/219,176

(22) Filed: Dec. 13, 2018

(65) Prior Publication Data
US 2019/0190768 A1    Jun. 20, 2019

(30) Foreign Application Priority Data

Dec. 14, 2017  (EP) .................................... 17207392

(51) Int. Cl.
*H04L 27/36* (2006.01)
*H04L 7/027* (2006.01)
(Continued)

(52) U.S. Cl.
CPC ............. *H04L 27/36* (2013.01); *H03F 3/195* (2013.01); *H03F 3/211* (2013.01); *H03F 3/2175* (2013.01); *H03F 3/245* (2013.01); *H03K 5/05* (2013.01); *H04L 7/027* (2013.01); *H03F 2200/09* (2013.01); *H03F 2200/451* (2013.01); *H03M 1/74* (2013.01)

(58) Field of Classification Search
CPC .......... H04L 27/36; H04L 7/027; H03F 3/211; H03F 3/245; H03F 3/2175; H03F 3/195; H03F 2200/451; H03F 2200/09; H03K 5/05; H03M 1/74

USPC .......................... 375/297; 455/63.1; 315/403
See application file for complete search history.

(56) References Cited

U.S. PATENT DOCUMENTS 5,861,776 A * 1/1999 Swanson ............... H03F 1/0244
                                                          330/124 R
7,668,249 B1    2/2010 Khlat
(Continued)

FOREIGN PATENT DOCUMENTS

GB          2515759 A       1/2015

OTHER PUBLICATIONS

European Search Report, European Patent Application No. 17207392. 6, dated May 22, 2018, 9 pages.

*Primary Examiner* — Fitwi Y Hailegiorgis
(74) *Attorney, Agent, or Firm* — McDonnell Boehnen Hulbert & Berghoff LLP (57) ABSTRACT

A digital power amplification circuit includes a decoding block configured to receive a first stream of digital codes and to derive from the first stream a second stream of digital codes, the decoding block including a decoder configured to decode the digital codes of the first stream and the second stream at a first clock rate, a main digital power amplifier configured to receive the decoded digital codes of the first stream, an upsampler configured to upsample the decoded digital codes of the second stream to a second clock rate that is greater than the first clock rate, an auxiliary digital power amplifier configured to receive the decoded digital codes of the second stream upsampled to the second clock rate, and a summer configured to sum (i) a main output signal of the main digital power amplifier and (ii) an auxiliary output signal of the auxiliary digital power amplifier.

18 Claims, 6 Drawing Sheets

(51) Int. Cl.
*H03K 5/05* (2006.01)
*H03F 3/195* (2006.01)
*H03F 3/217* (2006.01)
*H03F 3/24* (2006.01)
*H03F 3/21* (2006.01)
*H03M 1/74* (2006.01)

(56) References Cited

U.S. PATENT DOCUMENTS

| | | |
|---|---|---|
| 2005/0001748 A1 | 1/2005 | Clement et al. |
| 2005/0153675 A1 | 7/2005 | Yoon |
| 2008/0143278 A1* | 6/2008 | Zosel ................ B23K 15/0026 315/403 |
| 2009/0186582 A1* | 7/2009 | Muhammad ........... H04B 1/525 455/63.1 |
| 2010/0135368 A1 | 6/2010 | Mehta et al. |
| 2014/0266834 A1 | 9/2014 | Bruennert |

\* cited by examiner

DIGITAL POWER AMPLIFICATION CIRCUIT

CROSS-REFERENCE TO RELATED APPLICATIONS

The present application is a non-provisional patent application claiming priority to European Patent Application No. EP 17207392.6, filed on Dec. 14, 2017, the contents of which are hereby incorporated by reference.

FIELD OF THE DISCLOSURE

The present disclosure is generally related to the field of RF Digital-to-Analog Converters (RF-DAC) and digital power amplifiers.

BACKGROUND

Nanoscale CMOS has brought many high speed applications to the consumer thanks to the computing power that can be leveraged from modern signal processors. Unfortunately, the intrinsic analog properties of CMOS transistors generally do not follow the improvements of their digital counterparts. CMOS transistor parameters like output impedance, supply versus threshold ratio, or intrinsic gain typically worsen with the advance of the CMOS technological nodes.

One example of a relevant application field is digital radio transmitters. Modern communication schemes can impose strict requirements on radio transmitters. Transmitters operating at RF often have to combine strict requirements such as RF bandwidth, linearity, and out-of-band noise while maintaining a high efficiency. As a result, the porting of an analog RF transmitter from one technological node to another is complicated and thus slow and costly. Thus, it is often beneficial to design transmitters to have a reduced amount of analog circuitry. In addition, it is generally desirable for radio transmitters to be easily scalable with the advancement of CMOS technologies.

To address problems that can accompany analog RF transmitters, a new family of RF transmitters, digital transmitters (also referred to as RF-DACs or Direct Digital RF Modulators, DDRM), has been adopted. The digital transmitters feature predominantly digital circuitry which is better suited for advanced CMOS technology and which scales much better with the various CMOS technological nodes. In contrast to their analog counterpart, the performance of digital transmitters intrinsically improves with the scaling of CMOS technology.

The first digital transmitters were based on a polar architecture, in which a phase modulated local oscillator (LO) signal is fed to a multitude of DDRM units and amplitude modulation is performed by enabling or disabling (switching on or off) these DDRM unit amplifiers and then combining their output power to form a modulated RF analog signal. Later, Cartesian DDRM architectures consisting of two such digital amplitude modulators, for modulating the in-phase (I) and the quadrature (Q) signals with the respective LO phases, were also adopted in digital transmitters. The outputs of these two digital amplitude modulators are summed before being fed to the antenna for transmission.

Similar to a DAC, a digital power amplifier transforms digital input amplitude code into amplitude-modulated RF carrier. The digital-to-analog conversion unavoidably generates clock aliasing at multiples of the clock frequency.

In order to reduce the effect of aliasing, the sampling rate generally needs to be increased. To reduce the amount of quantization noise it is helpful to increase the accuracy. Although the total amount of quantization noise generally only relates to the digital-to-analog resolution/accuracy, the increase of sampling rate spreads the quantization noise into a wider bandwidth, so the quantization noise density is reduced.

A discrete-time input sample stream can be upsampled/interpolated with time alignment utilizing the addition of randomized high frequency noise. The upsampling mechanism can make use of a second order interpolator. The process can involve taking the derivative of the discrete-time input sample stream, thereby effectively providing another order of interpolation over a conventional interpolator. Before outputting the interpolated signal, an integrator can take the integral of the interpolated samples. Any processing performed between the derivative and integrator blocks can effectively provide an additional order of interpolation. High frequency noise (i.e. dithering) can be added to the differentiated samples in order to eliminate the spectral regrowth spurs that could otherwise appear in the output after rounding. Delay alignment can be performed on the differentiated samples in order to time align both phase/frequency and amplitude samples that are processed on different paths.

A digital quadrature rate converter and an oversampling interpolator can be presented for a DDRM. Digital quadrature modulation data can be received at one clock rate and oversampled digital quadrature modulation data can be provided at a higher clock rate. Rate conversion and oversampled interpolation can be used to accommodate systems with multiple clock frequencies and to generate modulation signals with low distortion. In this cascaded multi-rate approach all data is typically upsampled to the highest clock frequency.

The above-mentioned solutions typically end up upsampling all data to the highest clock frequency at the cost of higher power consumption for the digital circuits.

Hence, there is a need for a circuit with enhanced out-of-band spectral purity wherein these drawbacks are reduced or overcome.

SUMMARY

Embodiments of the present disclosure include a digital power amplification circuit that can reduce out-of-band alias tones while remaining power efficient.

In a first aspect, the disclosure relates to a digital power amplification circuit comprising:
  a decoding block arranged for receiving a first stream of digital codes and for deriving from the first stream a second stream of digital codes and comprising a decoder for decoding the digital codes of the first and the second stream at a first clock rate,
  a main digital power amplifier arranged for receiving the decoded digital codes of the first stream,
  an upsampler for upsampling the decoded digital codes of the second stream to a second clock rate higher than the first clock rate,
  an auxiliary digital power amplifier arranged for receiving the decoded digital codes of the second stream upsampled to the second clock rate, and
  a summer for summing a main output signal of the main digital power amplifier and an auxiliary output signal of the auxiliary digital power amplifier.

Embodiments can allow for reducing the out-of-band spectral emissions. By providing at least one auxiliary digital power amplifier arranged for operating at a higher clock rate than the main digital power amplifier it is possible to obtain a summed signal at the output.

In embodiments the second stream of digital codes is derived from the first stream of digital codes by computing a difference between the first stream and a delayed version of the first stream. In one embodiment the second stream is obtained by computing the difference of the first stream with the first stream delayed over one sample.

In some embodiments, the digital power amplification circuit comprises a circuit configured to delay the first stream of digital codes and a subtractor for determining the difference between the first stream and the delayed version of the first stream.

In some embodiments the auxiliary digital power amplifier has a higher resolution than the main digital power amplifier.

In embodiments, the first clock rate and the second clock rate are derived from a common clock signal.

In one embodiment, the digital codes comprise amplitude information of the summed main output signal and auxiliary output signal.

In other embodiments the digital power amplification circuit comprises a plurality of upsamplers and a plurality of auxiliary digital power amplifiers. Each upsampler can operate at its own upsampling factor.

In some embodiments the digital codes modulate a clock signal comprising phase information.

In another aspect the disclosure relates to a radio device comprising a digital power amplifier as previously described.

The above and other aspects of the disclosure will be apparent from and elucidated with reference to the embodiment(s) described hereinafter.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure presents a digital power amplification circuit that can help keep out-of-band emissions at a reduced level so that out-of-band emission requirements imposed by, e.g., an IEEE 802.11g mask can be met.

Figure 1:
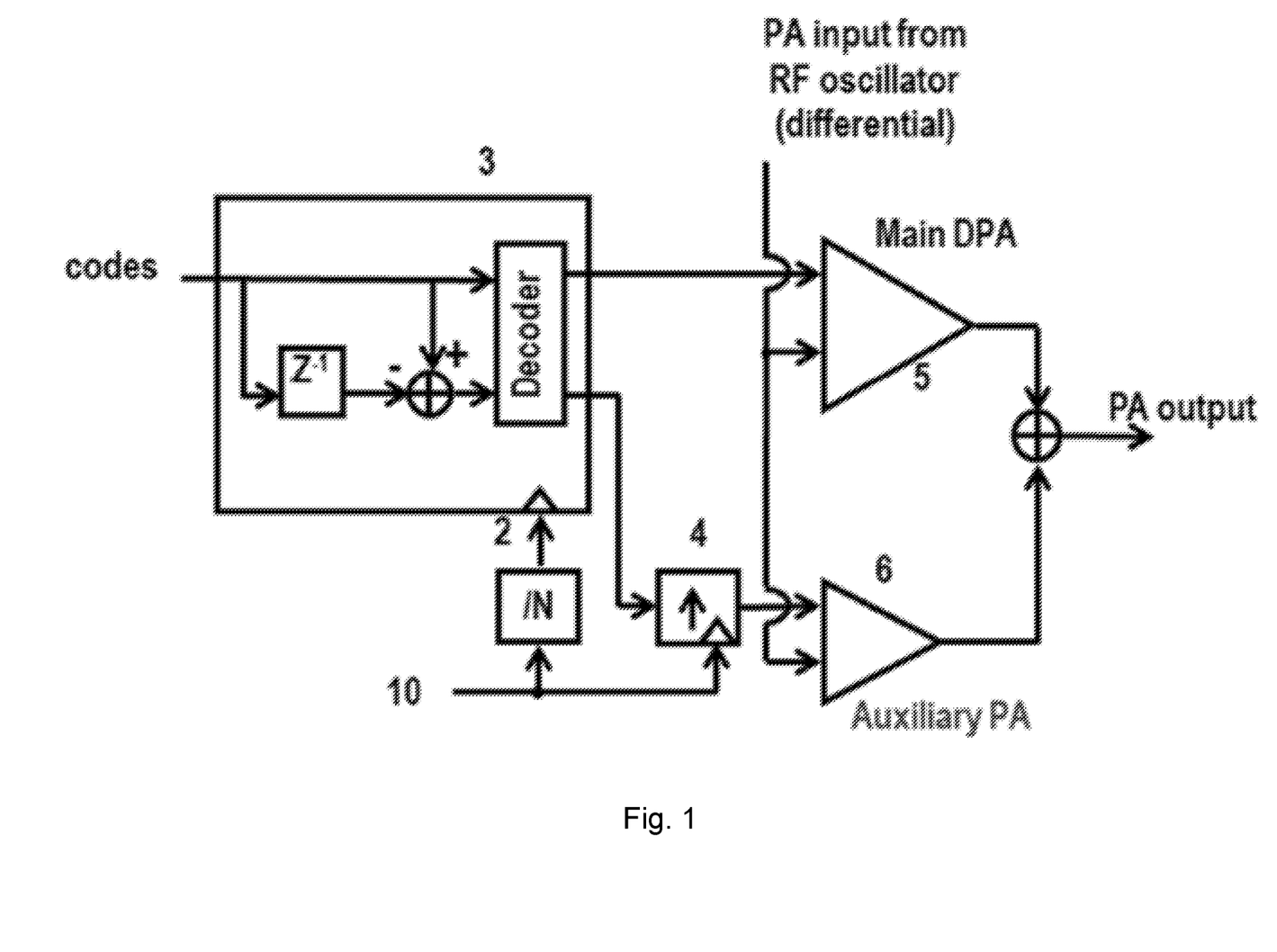
FIG. 1 is a schematic diagram of a digital power amplifier circuit, according to an embodiment.

A basic scheme of the proposed embodiment is illustrated in FIG. 1. In FIG. 1, the decoding block (3) one receives a stream of digital codes. Two parallel paths towards the decoder are provided: one direct path and one path comprising delay means for delaying the received stream over a given number of samples and subtraction means for computing a difference between the received stream and its delayed version. This difference is next also applied to the decoder. Both the received stream of digital codes and its delayed version are decoded at a first clock rate.

The stream of decoded digital codes along the direct path is applied to a main digital power amplifier (DPA) (5). The stream of decoded codes obtained from the difference of the applied stream and a delayed version thereof is upsampled to a second clock rate (4) higher than the first clock rate (2) and then fed to an auxiliary DPA (6). The output signals of the main DPA and the auxiliary DPA are then summed to obtain the resulting power amplifier output signal.

In summary, the circuit of FIG. 1 comprises a decoding block (3) (for example, a look-up table) that generates the input codes based on the originally received codes, e.g. AM codes. The main DPA (5) receives the input codes that were decoded at a first, low clock rate. Hence, the main DPA has a low resolution and a low clock rate. The auxiliary DPA (6) receives a stream of codes derived from the difference between the received stream and a delayed version thereof. This stream of differences is however first upsampled to a higher rate than the first clock rate and only then applied to the auxiliary DPA, which has a high resolution and a high clock rate.

In the embodiment shown in FIG. 1 the first (low) and second (high) clock rate are derived from a same clock (10). As illustrated in FIG. 1 the clock provides in this particular example the high clock rate. The low clock rate is obtained by dividing that high clock rate by an integer value N. Other implementations are readily available. In other embodiments the clock rates are derived from different clocks.

The delay over which the stream is delayed when deriving the difference between the applied stream and the delayed stream, can be configured. In an embodiment, the delayed stream is delayed over a single sample with respect to the received stream of digital codes.

Figure 2:
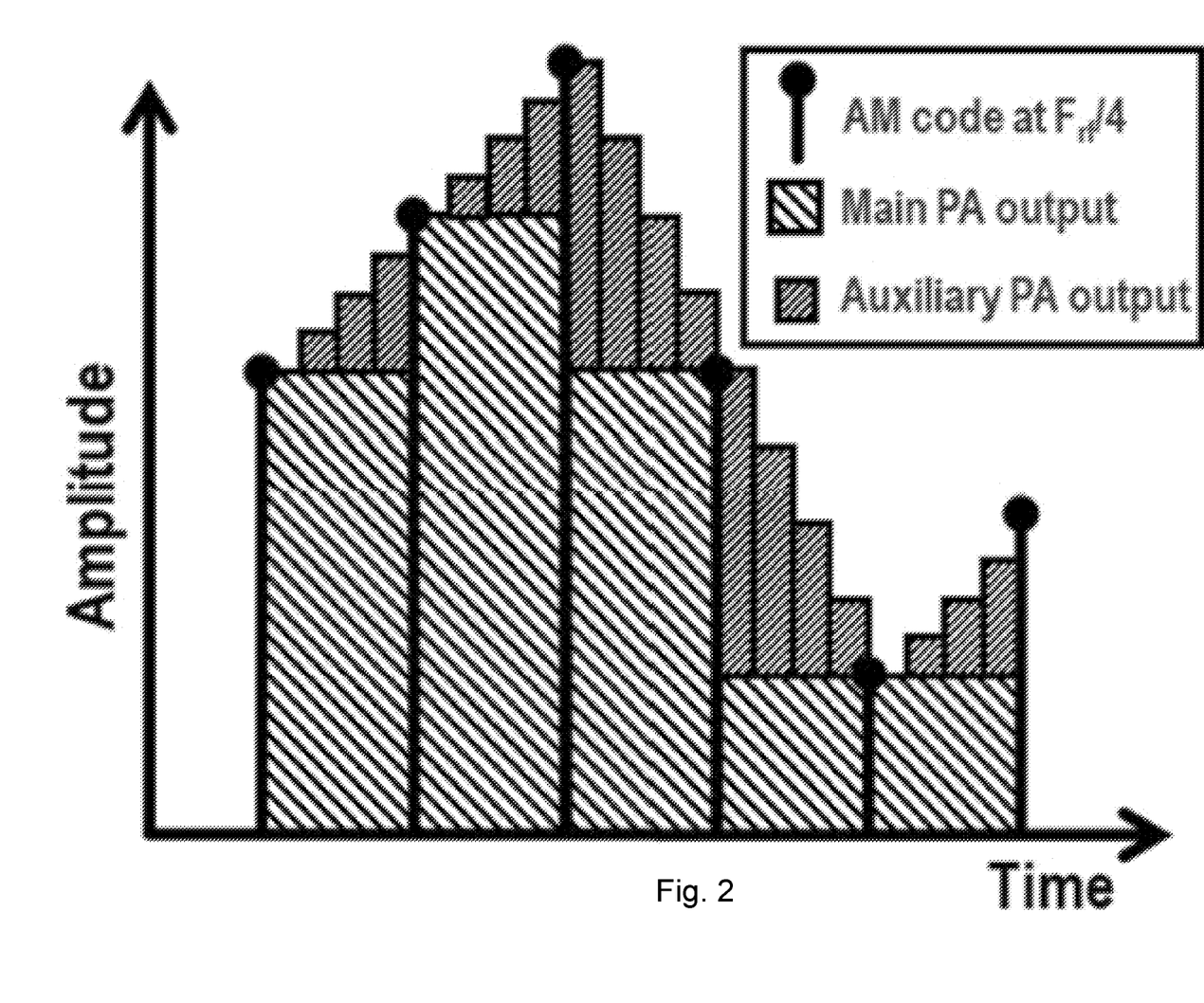
FIG. 2 illustrates an auxiliary digital power amplifier operating at a higher clock rate than the main digital power amplifier, according to an embodiment.

The principle on which the proposed approach is based is illustrated in FIG. 2 shows the codes (AM codes in this example) and the output signal of the main DPA. Both are at the same low clock rate. Based on the received digital codes, the main DPA produces the lower one of two adjacent codes. The auxiliary DPA receives the difference codes at a higher rate, in this example four times higher, than the rate at which the main DPA receives its inputs and produces small pulses at a four times higher rate, so filling the gaps and smoothing the amplitude transitions.

Figure 3:
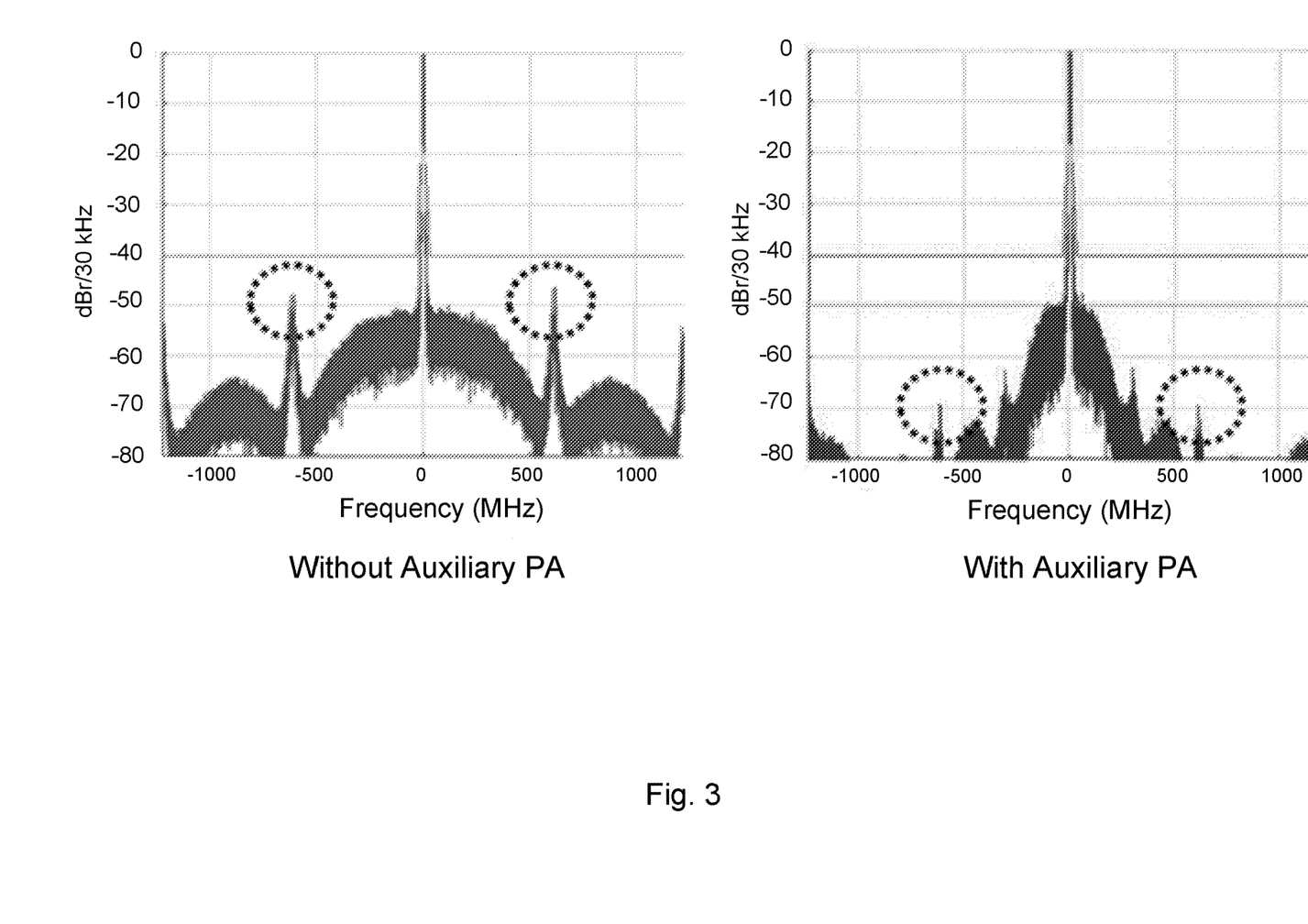
FIG. 3 illustrates a beneficial effect of the auxiliary DPA on the first alias tone, according to an embodiment.

To illustrate the effect of the auxiliary at higher resolution and higher clock rate FIG. 3 shows some simulation results. At the left side of FIG. 3, a conventional DPA is used, i.e. without an auxiliary DPA. At the right side of FIG. 3, an auxiliary DPA is used. By providing the auxiliary DPA as set out above, the amplitude level of the two alias tones indicated by a circle in FIG. 3 can be suppressed by about 20 dB.

Figure 4:
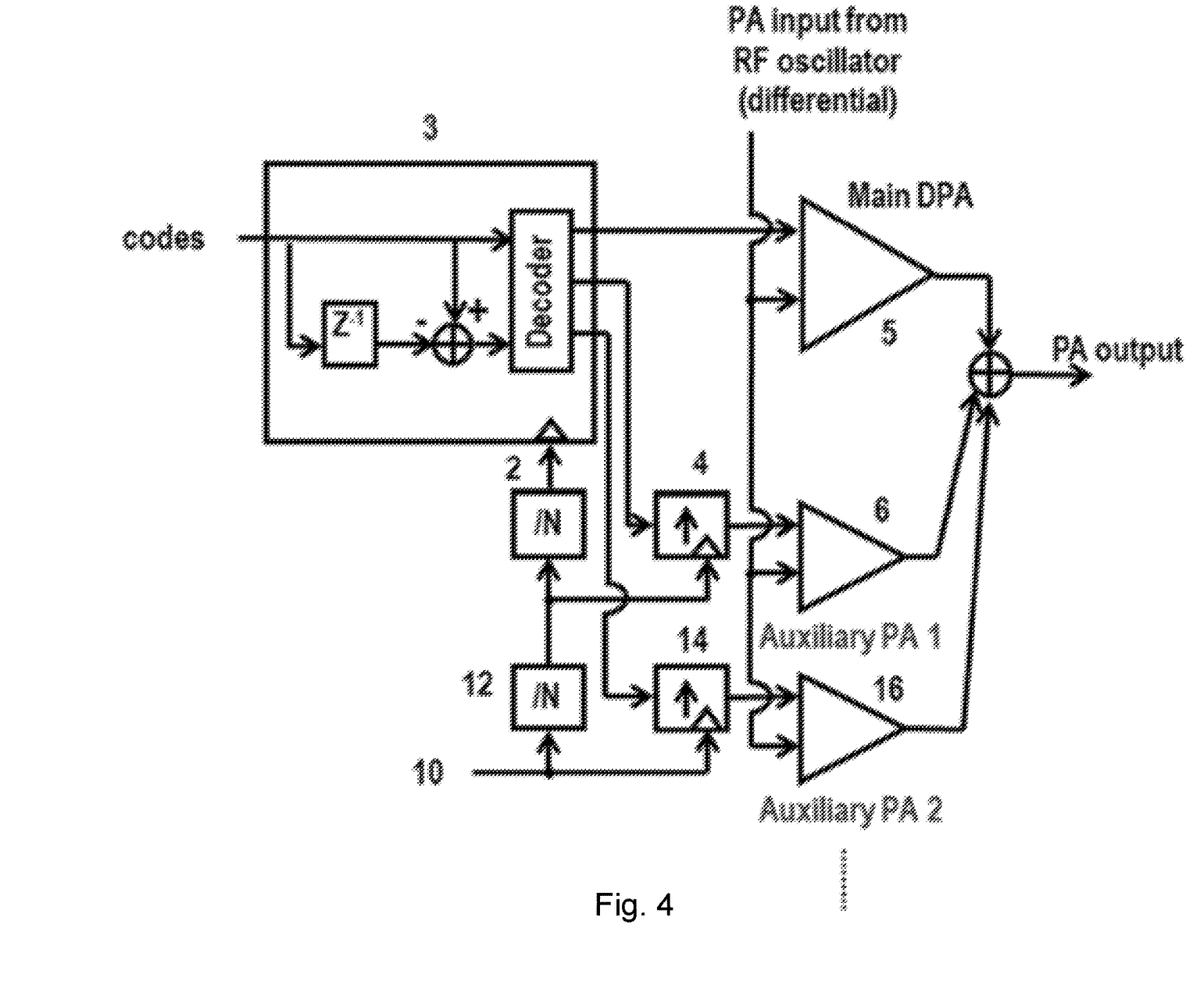
FIG. 4 illustrates a digital power amplifier circuit comprising a plurality of auxiliary DPAs and a plurality of upsamplers, according to an embodiment.

The embodiment of the digital amplifier circuit shown in FIG. 4 comprises a plurality of auxiliary DPAs and a plurality of upsamplers. In the example, auxiliary DPA1 (6) receives its input codes at a rate N times higher than the rate at which the first stream of digital codes is decoded. The other auxiliary digital power amplifier DPA2 (16) operates at a rate $N^2$ times higher than the lowest clock rate. As in FIG. 1, the clock (10) operates at the highest rate needed and portions thereof are used in the various stages of the circuit. It is repeated once again that there are obviously alternatives available to this approach.

Figure 5:
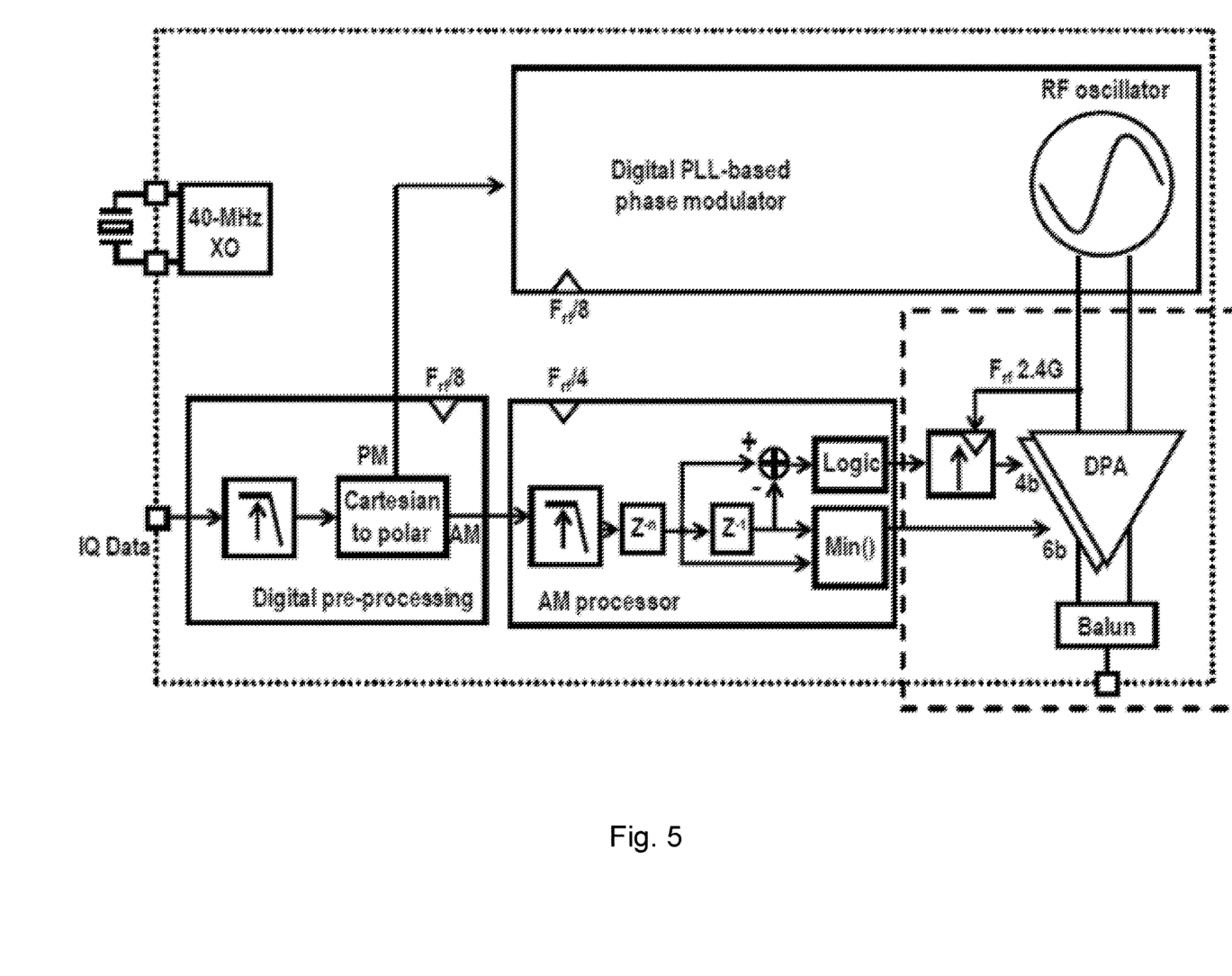
FIG. 5 illustrates a radio device comprising a digital power amplifier circuit, according to an embodiment.

In one aspect, the disclosure relates to a radio device comprising a digital power amplifier as previously described to suppress out-of-band alias tones. FIG. 5 shows an embodiment of such a radio device wherein the DPA circuit is used for out-of-band AM alias suppression.

The digital pre-processing block converts the original IQ data into amplitude and phase data. The digital PLL (Phase Locked Loop) based phase modulator modulates the phase of the RF oscillator output in accordance with the phase data. The differential output of the RF oscillator is thus a phase-modulated RF carrier for the digital power amplifier.

The 40 MHz crystal oscillator (XO) provides the reference clock for the digital PLL which generates a 2.4 GHz reference clock signal, $F_{rf}$. The 2.4 GHz RF frequency $F_{rf}$ is divided down to $F_{rf}/8$ (300 MHz) and $F_{rf}/4$ (600 MHz) inside the PLL. The $F_{rf}/8$ clock is used for the digital preprocessing block and the PLL-based phase modulator and the $F_{rf}/4$ clock is used for the AM processor. Generally, only the data stream for the 4 bit auxiliary DPA is upsampled to the clock frequency $F_{rf}$. Operating the AM and PM processing blocks with the right clock rate in combination with the above-presented power efficient approach with the multiple PAs can allow for achieving a very power efficient radio device.

The AM processor is equivalent to the decoding block (3) in FIG. 1, adding some additional functions for this particular radio. In the AM processor, the AM data stream from the pre-processing block is first upsampled to the $F_{rf}/4$ clock rate and then filtered. In addition, in the block $Z^{-n}$ the delay between the AM path and the PM path is adjusted. The decoder of the block (3) in FIG. 1 is implemented in FIG. 5 as a "min( )" function for the first data stream (to the main DPA) and a look-up table (shown as "Logic") for the second data stream (to the auxiliary DPA). This implementation is one way to obtain the function as illustrated in FIG. 2.

Figure 6:
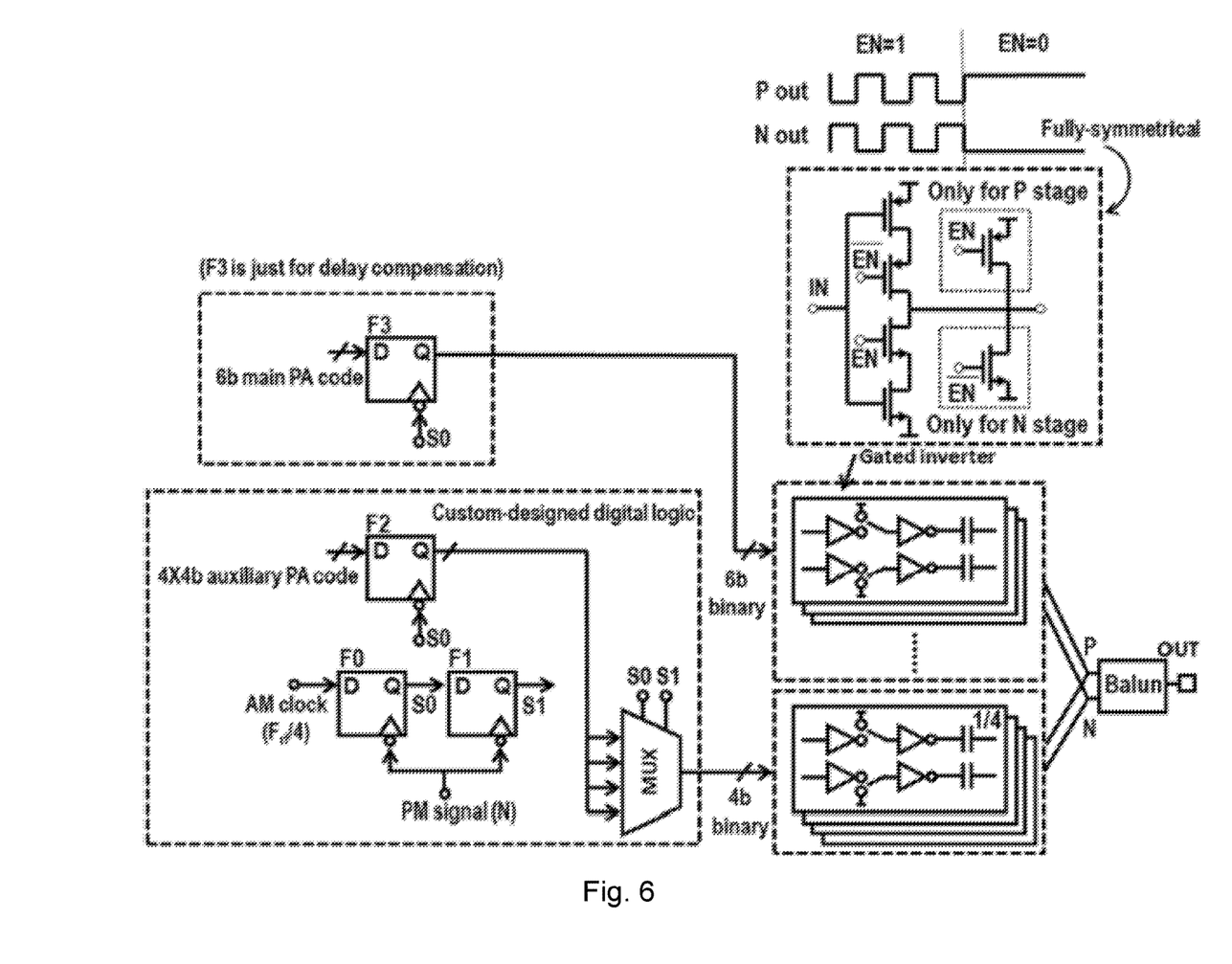
FIG. 6 illustrates an implementation of the digital power amplifier and the upsampler inside the dotted line in FIG. 5, according to an embodiment.

An exploded view of the part in dashed line of FIG. 5 is given in FIG. 6. The flip-flop F3 compensates any remaining delay difference between the first and second data streams being fed to the main and the auxiliary DPA.

The wide-band operation of the digital transmitter generally puts strict requirements on the AM path, especially for suppressing out-of-band spurs. In a conventional architecture, the digital PAs rely on sinc filtering originating from the digital-to-analog conversion to suppress clock aliases. Although the clock aliases can also be reduced by pushing the final oversampling rate to $F_{rf}$, it can dramatically raise the total power consumption. Therefore, the above-presented power-efficient approach with multiple PAs working at multiple rates is here employed.

A main 6-bit power amplifier generates the minimal required amplitude based on the AM data at the $F_{rf}/4$ rate and an auxiliary 4-bit power amplifier smooths the amplitude transition with finer resolution at the $F_{rf}$ rate. In this case, the AM modulation is split into a low-resolution low-rate modulation for power delivery and a high-resolution high-rate modulation for pulse shaping as illustrated in FIG. 2. The look-up table (shown as "Logic" in FIG. 5) in the AM processor synthesized at the $F_{rf}/4$ rate generates 4×4 bit control codes for the auxiliary PA each time (as each control code is 4-bit, so 4×4 bit auxiliary AM codes) and then is retimed to the correct sequence at the $F_{rf}$ rate by the custom-designed digital logic, thereby upsampling the second AM data steam to the $F_{rf}$ clock domain. In the digital logic this is performed by the flip flop F2. Flip flops F0 and F1 generate the control signal for the MUX, which then selects the corresponding 4-bit AM code to be fed to the auxiliary PA at the $F_{rf}$ rate.

The main PA comprises 6 PA unit cells each receiving a corresponding bit from the 6-bit code. Similarly, the auxiliary PA comprises 4 PA unit cells each receiving a corresponding bit from the 4-bit code. The implementation of the main PA unit cell is the same as the auxiliary PA unit cell, except that the size of the auxiliary PA unit cell is 4 times smaller.

The PAs are implemented in a differential topology, the gated inverters for the differential stages P and N are implemented differently as shown in FIG. 6. The gated inverter of each PA unit is taped to $V_{DD}$ or $V_{SS}$ in the off mode (EN=0) for the P and N stages, respectively. So the rising and falling edges of the P and N stages are fully symmetrical. Such a fully-differential operation guarantees a better PA linearity. Finally, the balun sums the main and the auxiliary PA(s) output signals and converts the differential output to a single-ended output.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A digital power amplification circuit comprising:
   a decoding block configured to receive a first stream of digital codes and to derive from the first stream a second stream of digital codes, the decoding block comprising a decoder configured to decode the digital codes of the first stream and the second stream at a first clock rate, wherein the decoding block is configured to derive the second stream of digital codes from the first stream by computing a difference between the first stream and a delayed version of the first stream that is delayed over one sample,
   a main digital power amplifier configured to receive the decoded digital codes of the first stream,
   an upsampler configured to upsample the decoded digital codes of the second stream to a second clock rate that is greater than the first clock rate, an auxiliary digital power amplifier configured to receive the decoded digital codes of the second stream upsampled to the second clock rate, and a summer configured to sum (i) a main output signal of the main digital power amplifier and (ii) an auxiliary output signal of the auxiliary digital power amplifier.

2. The digital power amplification circuit of claim 1, wherein the decoding block comprises a circuit configured to delay the first stream of digital codes and a subtractor configured for determining the difference between the first stream and the delayed version of the first stream.

3. A radio device comprising the digital power amplification circuit of claim 2.

4. The digital power amplification circuit of claim 1, wherein the auxiliary digital power amplifier has a higher resolution than the main digital power amplifier.

5. A radio device comprising the digital power amplification circuit of claim 4.

6. The digital power amplification circuit of claim 1, wherein the first clock rate and the second clock rate are derived from a common clock signal.

7. A radio device comprising the digital power amplification circuit of claim 6.

8. The digital power amplification circuit of claim 1, further comprising a plurality of upsamplers and a plurality of auxiliary digital power amplifiers.

9. The digital power amplification circuit of claim 8, wherein each upsampler of the plurality of upsamplers is operable at its own upsampling factor.

10. A radio device comprising the digital power amplification circuit of claim 9.

11. A radio device comprising the digital power amplification circuit of claim 8.

12. The digital power amplification circuit of claim 1, wherein the first stream of digital codes are modulated with a clock signal comprising phase information.

13. A radio device comprising the digital power amplification circuit of claim 12.

14. A radio device comprising the digital power amplification circuit of claim 1.

15. A digital power amplification circuit comprising:
a decoding block configured to receive a first stream of digital codes and to derive from the first stream a second stream of digital codes, the decoding block comprising a decoder configured to decode the digital codes of the first stream and the second stream at a first clock rate, a main digital power amplifier configured to receive the decoded digital codes of the first stream, an upsampler configured to upsample the decoded digital codes of the second stream to a second clock rate that is greater than the first clock rate, an auxiliary digital power amplifier configured to receive the decoded digital codes of the second stream upsampled to the second clock rate, and a summer configured to sum (i) a main output signal of the main digital power amplifier and (ii) an auxiliary output signal of the auxiliary digital power amplifier, wherein the first stream of digital codes comprise amplitude information of the sum of the main output signal and the auxiliary output signal.

16. A radio device comprising the digital power amplification circuit of claim 15.

17. A digital power amplification circuit comprising:
a decoding block configured to receive a first stream of digital codes and to derive from the first stream a second stream of digital codes, the decoding block comprising a decoder configured to decode the digital codes of the first stream and the second stream at a first clock rate, wherein the decoding block is configured to derive the second stream of digital codes from the first stream by computing a difference between a first code of the first stream and a second code of the first stream that immediately precedes the first code within the first stream, a main digital power amplifier configured to receive the decoded digital codes of the first stream, an upsampler configured to upsample the decoded digital codes of the second stream to a second clock rate that is greater than the first clock rate, an auxiliary digital power amplifier configured to receive the decoded digital codes of the second stream upsampled to the second clock rate, and a summer configured to sum (i) a main output signal of the main digital power amplifier and (ii) an auxiliary output signal of the auxiliary digital power amplifier.

18. A radio device comprising the digital power amplification circuit of claim 17.

* * * * *